(12) United States Patent
Papadopoulos et al.

(10) Patent No.: US 12,128,776 B2
(45) Date of Patent: Oct. 29, 2024

(54) ELECTRONIC CIRCUIT BREAKER WITH SELF-TRIGGERING PROTECTION FOR A VEHICLE, AND A METHOD THEREFOR

(71) Applicant: Scania CV AB, Södertälje (SE)

(72) Inventors: Georgios Papadopoulos, Edessa (GR); Carl Tengstedt, Grödinge (SE); Jens Gustavsson, Strängnäs (SE); Christer Roos, Rönninge (SE); Hans-Peter Nee, Bro (SE)

(73) Assignee: Scania CV AB, Södertälje (SE)

(*) Notice: Subject to any disclaimer, the term of this patent is extended or adjusted under 35 U.S.C. 154(b) by 275 days.

(21) Appl. No.: 17/638,963

(22) PCT Filed: Sep. 3, 2020

(86) PCT No.: PCT/SE2020/050833
§ 371 (c)(1),
(2) Date: Feb. 28, 2022

(87) PCT Pub. No.: WO2021/045669
PCT Pub. Date: Mar. 11, 2021

(65) Prior Publication Data
US 2022/0340020 A1    Oct. 27, 2022

(30) Foreign Application Priority Data
Sep. 5, 2019   (SE) ................... 1951011-4

(51) Int. Cl.
*H02H 3/00*      (2006.01)
*B60L 3/04*      (2006.01)
(Continued)

(52) U.S. Cl.
CPC ............. *B60L 50/64* (2019.02); *B60L 3/04* (2013.01); *H02H 3/087* (2013.01)

(58) Field of Classification Search
None
See application file for complete search history.

(56) References Cited

U.S. PATENT DOCUMENTS

| 5,616,970 A | 4/1997 | Dittrich |
| 9,130,405 B2 | 9/2015 | Chatroux et al. |
| (Continued) | | |

FOREIGN PATENT DOCUMENTS

| CN | 107706882 A | 2/2018 |
| EP | 666647 A1 | 8/1995 |
| (Continued) | | |

OTHER PUBLICATIONS

Scania Cv Ab, International Patent Application No. PCT/SE2020/050833, International Search Report, Oct. 15, 2020.
(Continued)

*Primary Examiner* — Stephen W Jackson
(74) *Attorney, Agent, or Firm* — Moore & Van Allen PLLC; W. Kevin Ransom

(57) ABSTRACT

An electronic circuit breaker comprising: an input connected to an electric DC power supply; an output connected to a load; the input connected to the output via a switch, said switch is controlled via a switch control line between an "ON"-state and an "OFF"-state; a switch driver connected to the switch control line, said switch driver configured to control the switch; and a switch protection, a voltage detection branch configured to output a first electric potential indicative of the electrical potential difference between the input and the output; a comparator circuit configured to compare the first electrical potential with a first threshold voltage, said first threshold voltage is indicative of an over-current level flowing through the switch; and a gate controller connected to the switch disable line and configured to disable the switch by connecting the switch control (Continued)

line to a potential which causes the switch to enter the "OFF"-state.

11 Claims, 3 Drawing Sheets

(51) Int. Cl.
*B60L 50/64* (2019.01)
*H02H 3/087* (2006.01)

(56) References Cited

U.S. PATENT DOCUMENTS

| | | | |
|---|---|---|---|
| 2002/0034086 A1* | 3/2002 | Scoggins | H02P 13/06 |
| | | | 363/39 |
| 2003/0183838 A1 | 10/2003 | Huang et al. | |
| 2006/0267557 A1 | 11/2006 | Nakano et al. | |
| 2011/0075307 A1 | 3/2011 | Murota | |
| 2011/0085274 A1 | 4/2011 | Jarman | |
| 2014/0239713 A1 | 8/2014 | Kanzaki et al. | |
| 2015/0311815 A1 | 10/2015 | Nedic et al. | |
| 2017/0294773 A1 | 10/2017 | Illing et al. | |
| 2018/0026566 A1* | 1/2018 | Stewart | H02P 25/02 |
| | | | 290/45 |
| 2018/0048142 A1 | 2/2018 | Immel et al. | |
| 2018/0183228 A1 | 6/2018 | Huber | |
| 2018/0198442 A1 | 7/2018 | Hokazono et al. | |
| 2018/0309433 A1 | 10/2018 | Volke et al. | |
| 2019/0103865 A1 | 4/2019 | Jang et al. | |

FOREIGN PATENT DOCUMENTS

| | | |
|---|---|---|
| EP | 2372856 A1 | 10/2011 |
| SE | 543846 C2 | 8/2021 |
| WO | 2011074403 A1 | 6/2011 |
| WO | 2012171917 A1 | 12/2012 |

OTHER PUBLICATIONS

Scania Cv Ab, International Patent Application No. PCT/SE2020/050833, Written Opinion, Oct. 15, 2020.
Scania Cv Ab, Swedish Patent Application No. 1951011-4, Office Action, Feb. 24, 2020.
Scania Cv Ab, International Patent Application No. PCT/SE2020/050833, International Preliminary Report on Patentability, Mar. 8, 2022.
Scania Cv Ab, European Patent Application No. 20860357.1, Extended European Search Report, Sep. 1, 2023.
Scania CV AB, Chinese Patent Application No. 202080056047.3, First Office Action, May 29, 2024.

* cited by examiner

ELECTRONIC CIRCUIT BREAKER WITH SELF-TRIGGERING PROTECTION FOR A VEHICLE, AND A METHOD THEREFOR

CROSS-REFERENCE TO RELATED APPLICATIONS

This application is a National Stage Patent Application (filed under 35 § U.S.C. 371) of PCT/SE2020/050833, filed Sep. 3, 2020 of the same title, which, in turn claims priority to Swedish Patent Application No. 1951011-4 filed Sep. 5, 2019 of the same title; the contents of each of which are hereby incorporated by reference.

FIELD OF THE INVENTION

The present invention relates to an electronic circuit breaker with self-triggering protection for a vehicle, comprising: an input configured to be connected to an electric DC power supply; an output configured to be connected to a load; the input is connected to the output via a switch, said switch is controlled via a switch control line between an "ON"-state and an "OFF"-state; a switch driver connected to the switch control line, said switch driver is configured to control the switch.

The invention also relates to a battery junction box comprising such an electronic circuit breaker, and a battery pack comprising such a battery junction box.

BACKGROUND OF THE INVENTION

Conventional electronic circuit breakers for vehicles often employs a current shunt in order to measure the current through the electronic circuit breaker, and if an over-current is detected the current is interrupted by means of dedicated circuits. However in a vehicle which utilizes modern high energy propulsion batteries such current shunts are quite expensive and requires specific safety measures. Furthermore, high energy propulsion batteries require components to ensure safety in the case of short circuit, or other hazardous event. The safety is commonly provided by a set of contactors and a fuse. The contactors interrupts the circuit at moderate currents and the fuse breaks at excessive currents. There exists different types of fuses and contactors, and depending on the design they provide different degrees of safety. If in the protection system a solid state circuit breaker is used, then the semiconductor switch will require an external triggering in order to clear a short-circuit in the circuit, which entails that a current sensing method should be used as well.

It is thus an object of the present invention to present an electronic circuit breaker that may be used with high energy propulsion batteries that mitigates some of the above discussed problems.

SUMMARY OF THE INVENTION

The object of the invention is achieved by means of the initially defined electronic circuit breaker with self-triggering protection for a vehicle, said electric circuit breaker being characterized by: a switch protection connected between the input and the output and parallel with the switch, said switch protection is further connected to the switch control line, wherein the switch protection comprises: an over voltage protection branch extending from the input to the output; a voltage detection branch extending from the input to the output and configured to output a first electric potential indicative of the electrical potential difference between the input and the output; a comparator circuit configured to compare the first electrical potential with a first threshold voltage, said first threshold voltage is indicative of an over-current level flowing through the switch, which over-current causes a voltage drop over the switch, said comparator circuit outputs a switch disable signal via a switch disable line upon detecting that the first electrical potential is above the first threshold voltage; and a gate controller connected to the switch disable line and configured to disable the switch by connecting the switch control line to a potential which causes the switch to enter the "OFF"-state.

According to an embodiment, the comparator circuit further is configured to: delay the switch disable signal a predetermined time in order to determine that the first electrical potential is above the first threshold voltage after said predetermined time, and thereby indicative of a short-circuit at the output. This allows the electric circuit breaker to distinguish between a permanent short-circuit or a temporary over-current.

According to an embodiment, the voltage detection branch comprises: a first diode with a cathode connected to the input, and an anode connected to a second node; said second node connected to said first node via a first resistor; said first node connected to the output via a second resistor; and said first electric potential is at said first node. This allows a detection of an over-current without a current shunt.

According to an embodiment, said switch is a MOSFET with a drain connected to the input and with a source connected to the output, and a gate is connected to said switch control line; and said gate controller is configured to disable the MOSFET by connecting the switch control line to the output via a first resistor, which causes the MOSFET to enter the "OFF"-state, upon receiving said switch disable signal at the switch disable line.

According to an embodiment, the over-voltage protection branch comprises a snubber circuit comprising: a capacitor connected in series with a resistor and a diode in parallel with the resistor. The snubber circuit will literally clamp the voltage spike.

The object of the invention is also achieved by means of a battery junction box for a battery pack of a vehicle. The battery junction box comprises: a positive input terminal configured to be connected to a plus pole of at least one battery module; a negative input terminal configured to be connected to a negative pole of said battery module; a positive output terminal configured to be connected to a negative output terminal via load of the vehicle; said negative input terminal connected to said negative output terminal via a fuse in series with a main switch; a commutate circuit comprising a diode with a cathode connected to the positive output terminal, and an anode connected to said negative output terminal; and wherein the battery junction box is characterized by further comprising an electronic circuit breaker according to embodiments of the present invention, wherein: said input of the electronic circuit breaker is connected to said positive input terminal; said output of the electronic circuit breaker is connected to said positive output terminal.

The object of the invention is also achieved by means of a battery pack for a vehicle comprising at least one battery module with at least one battery cell, and said battery pack being characterized by comprising a battery junction box according to the present invention.

The object of the invention is also achieved by means of a vehicle characterized by comprising a battery pack according to the present invention, or an electronic circuit breaker according to the present invention.

The object of the invention is also achieved by means of a method of an electronic circuit breaker for a vehicle, wherein the electronic circuit breaker comprises: an input configured to be connected to an electric DC power supply; an output configured to be connected to a load; the input is connected to the output via a switch, said switch is controlled via a switch control line between an "ON"-state and an "OFF"-state; and the method is characterized by comprising the steps of: determining if the switch is in the "ON" state; measuring first electrical potential indicative of the current flowing from the input terminal to the output terminal, upon determining that the switch is in the "ON"-state; comparing the first electrical potential with a first threshold voltage, which is indicative of an over-current level of the switch, and if the first electrical potential is larger than the first threshold cause the switch to enter the "OFF"-state.

According to one embodiment, the method further comprises the steps of: waiting a predetermined time, upon determining that the first electrical potential is larger than the first threshold; comparing the first electrical potential with said first threshold voltage a second time, after waiting said predetermined time; maneuver the switch to the "OFF" state after the second time if the first electrical potential is larger than the first threshold voltage, upon comparing the first electrical potential with said first threshold value for the second time.

Further features and advantages of the invention will be presented in the following detailed description of embodiments.

DETAILED DESCRIPTION

Figure 1:
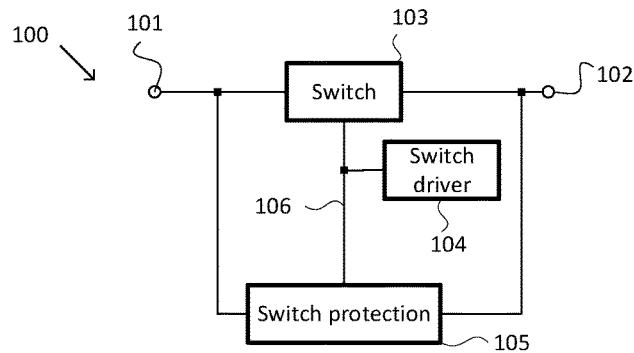
FIG. 1 is a schematic block diagram of an electronic circuit breaker according to an embodiment.

FIG. 1 shows an electronic circuit breaker with self-triggering protection for a vehicle, generally designated 100. The electronic circuit breaker comprises an input 101 configured to be connected to an electric DC power supply, an output 102 configured to be connected to a load. The input is connected to the output via a switch 103, said switch is controlled via a switch control line 106 between an "ON"-state and an "OFF"-state. A switch driver 104 is connected to the switch control line, and said switch driver is configured to control the switch.

Figure 2:
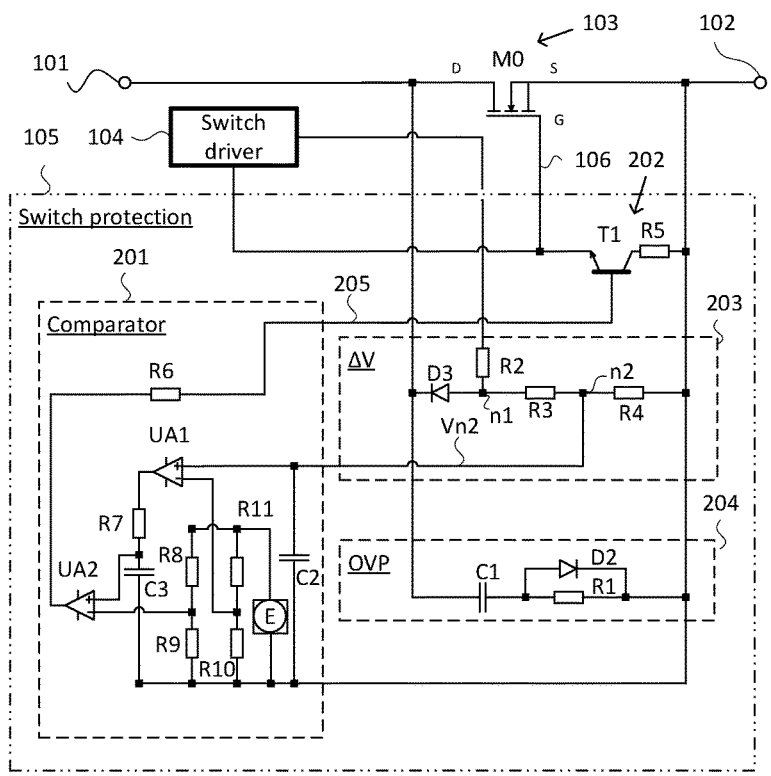
FIG. 2 is a schematic circuit diagram of an electric circuit breaker according to an embodiment.

FIG. 2 shows the switch protection 105 in more detail and the switch 103 is a MOSFET M0 with a drain D connected to the input and with a source S connected to the output, and a gate G is connected to said switch control line 106. The gate controller is configured to disable the MOSFET by connecting the switch control line to the output via a first resistor R5, which causes the MOSFET M0 to enter the "OFF"-state, upon receiving said switch disable signal at the switch disable line.

The switch protection 105 is connected between the input 101 and the output 102 and parallel with the switch 103, said switch protection is further connected to the switch control line 106. The switch protection 105 comprises: an over-voltage protection branch 204 extending from the input to the output; a voltage detection branch 203 extending from the input to the output and configured to output a first electric potential Vn2 indicative of the electrical potential difference between the input and the output; a comparator circuit 201 configured to compare the first electrical potential with a first threshold voltage, said first threshold voltage is indicative of an over-current level flowing through the switch, which over-current causes a voltage drop over the switch, said comparator circuit outputs a switch disable signal via a switch disable line upon detecting that the first electrical potential is above the first threshold voltage; and a gate controller 202 connected to the switch disable line and configured to disable the switch by connecting the switch control line to a potential which causes the switch to enter the "OFF"-state.

The comparator circuit 201 further is configured to: delay the switch disable signal a predetermined time in order to determine that the first electrical potential is above the first threshold voltage after said predetermined time, and thereby indicative of a short-circuit at the output. This delay is implemented as a RC circuit with resistor R7 and capacitor C3 as shown in FIG. 2.

Furthermore, in FIG. 2 in the comparator circuit 201, the voltage source E and the resistor R10 and R11 are used to set the first threshold voltage used in a first comparator UA1 for determining that the current as indicated as voltage Vn2 is larger than the first threshold. The voltage divider formed by resistor R8 and resistor R9 are also used to set a threshold that is compared with the delayed signal from the RC-circuit formed by resistor R7 and capacitor C3 in a second comparator UA2, wherein the output from the comparator UA2 is connected to the gate controller 202 (to the base of transistor T1) via resistor R6. The first comparator UA1 is used to detect over-current, and the second comparator is used to determine if it is a temporary over-current or a permanent short-circuit. Transistor T1 comprises a base connected to the output of comparator UA2 via a resistor R6, an emitter of the transistor T1 is connected to the gate G of the MOSFET M0 as well as to the switch controller. A collector of transistor T1 is connected to the source of MOSFET M0 via resistor R5. This way the transistor T1 controls if the switch driver 104 is able to control the MOSFET M0, since if transistor T1 is activated the $V_{Gs}$ voltage (gate source potential) becomes sufficiently small to turn off MOSFET M0.

The voltage detection branch 203 comprises: a first diode D3 with a cathode connected to the input, and an anode connected to a second node n1. The second node n1 is connected to said first node n2 via a first resistor R3, the first node n2 is connected to the output via a second resistor R4, and the first electric potential Vn2 at said first node n2. The voltage drop over the second resistor R4 is indicative of the current flowing through the MOSFET M0, when the MOSFET is in the "ON"-state.

The over-voltage protection branch 204 comprises a snubber circuit, of the RCD-type and comprising: a capacitor C1 connected in series with a resistor R1 and a diode D2 in parallel with the resistor. Other types and variants of snubber circuits may also be used in the over-voltage protection branch.

The switch protection 105 is self-triggering and needs no manual reset after triggering. When the over-current is no longer detected the switch protection allows the switch driver 104 to control the MOSFET M0.

Figure 3:
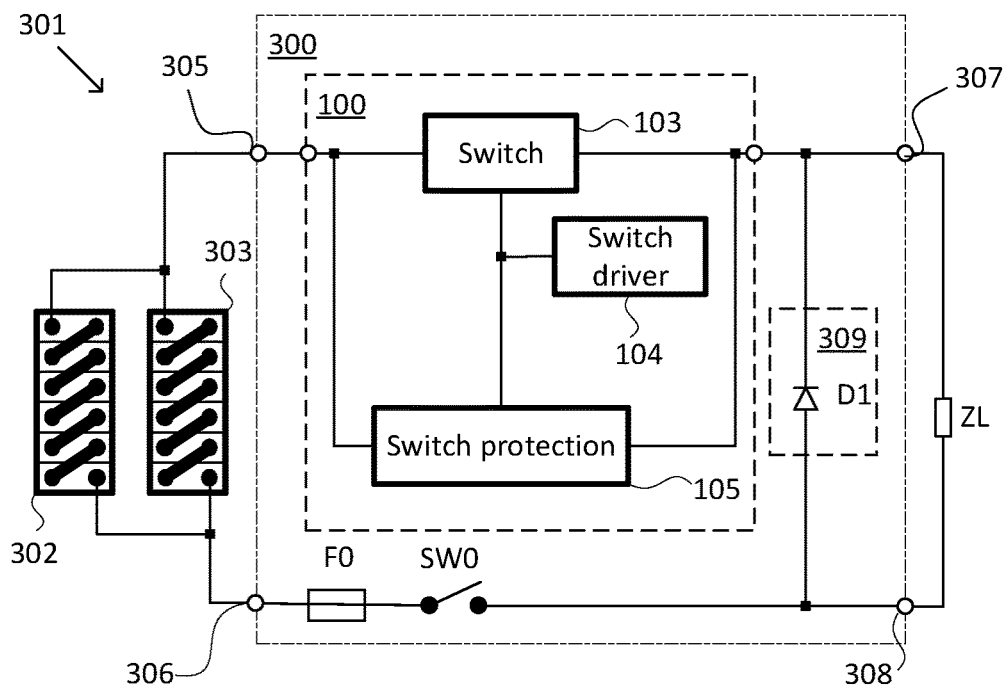
FIG. 3 is a schematic block diagram of a battery junction box according to an embodiment, as well as a battery pack comprising such a battery junction box.

With reference to FIG. 3 a battery junction box 300 for a battery pack 301 of a vehicle will now be described. The battery junction box 300 comprises a positive input terminal 305 configured to be connected to a plus pole of at least one battery module 302, 303, a negative input terminal 306 configured to be connected to a negative pole of said battery module 302, 303. The battery junction box further comprises a positive output terminal 307 configured to be connected to a negative output terminal 308 via load ZL of the vehicle, which load may be the DC-link with associated inverters and motors connected thereto. The negative input terminal is connected to said negative output terminal via a fuse FO in series with a main switch SW0. The battery junction box further comprises a commutate circuit 309 comprising a diode D1 with a cathode connected to the positive output terminal, and an anode connected to said negative output terminal; and wherein the battery junction box further comprises an electronic circuit breaker 100 according to the present invention and disclosed with reference made to FIG. 1 and FIG. 2. The input of the electronic circuit breaker is connected to said positive input terminal 305, and the output of the electronic circuit breaker is connected to the positive output terminal 307.

With reference made to the above discussed FIG. 3 a battery pack 301 for a vehicle 400 is disclosed. The battery pack comprises at least one battery module with at least one battery cell. Furthermore, the battery pack comprises a battery junction box 300 of the principle design discussed above with reference made to FIG. 3.

Figure 4:
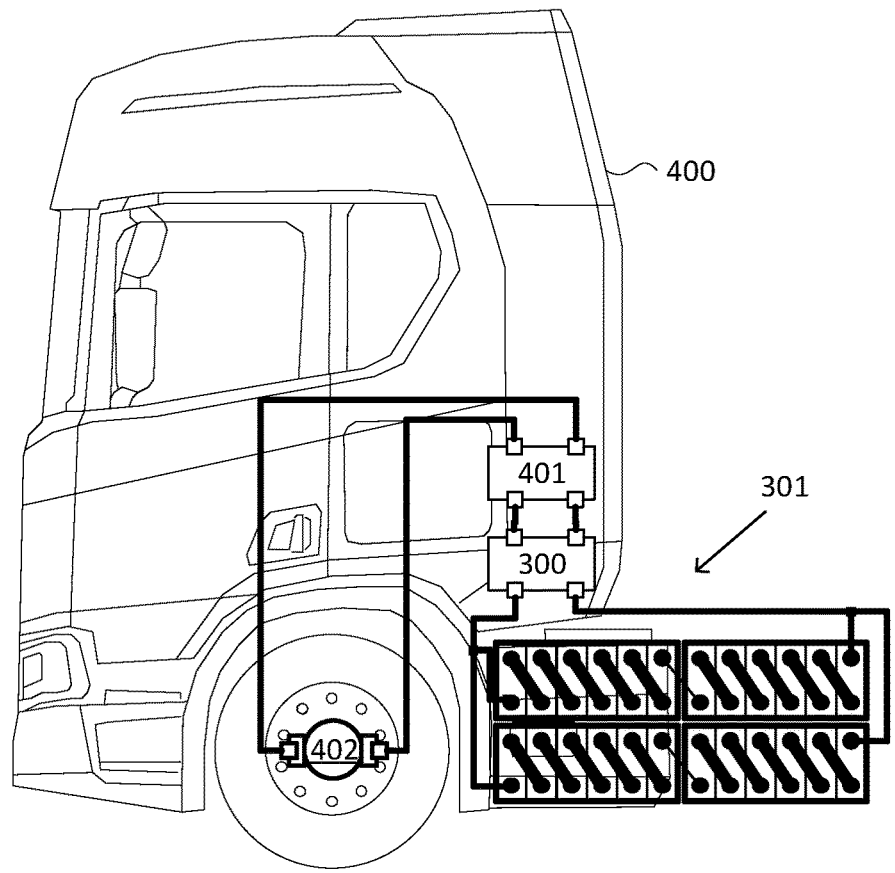
FIG. 4 is a schematic drawing of a vehicle with a battery pack according to an embodiment.

FIG. 4 shows a vehicle 400 comprising a battery pack 301 according to the present invention and described herein above. The battery junction box 300 is connected via a DC-link to an inverter 401 that is powering an electrical motor 402.

Figure 5:
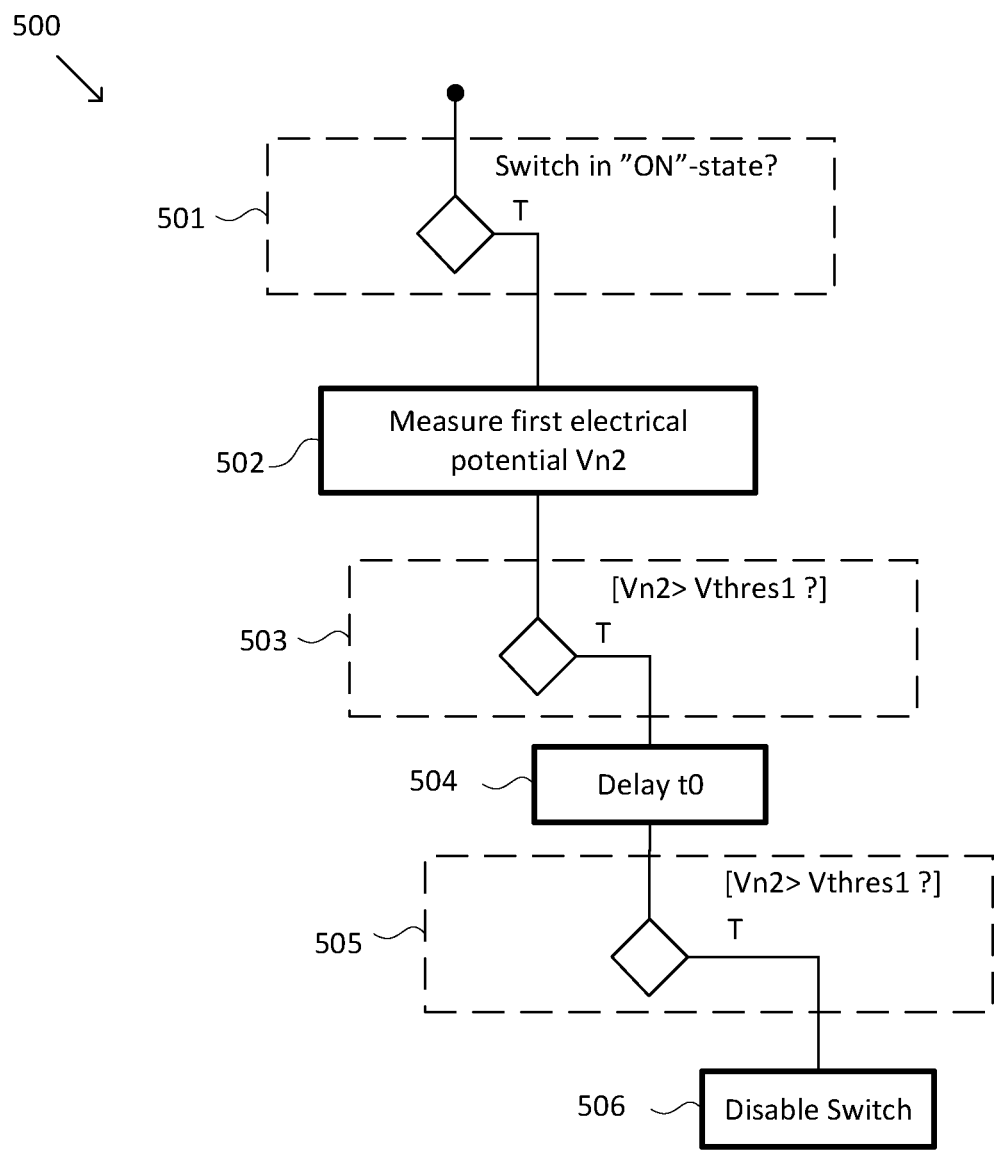
FIG. 5 is a flowchart illustrating a method according to an embodiment.

In FIG. 5 a method 500 of an electronic circuit breaker for a vehicle is disclosed. The electronic circuit breaker 100 comprises: an input 101 configured to be connected to an electric DC power supply; an output 102 configured to be connected to a load; the input is connected to the output via a switch 103, said switch is controlled via a switch control line 106 between an "ON"-state and an "OFF"-state;

The method comprises the steps of:

Determining 501 if the switch is in the "ON" state.

Measuring 502 the first electrical potential Vn2 indicative of the current flowing from the input terminal to the output terminal, upon determining that the switch is in the "ON"-state.

Comparing 503 the first electrical potential Vn2 with a first threshold voltage, which is indicative of an over-current level of the switch, and if the first electrical potential is larger than the first threshold cause the switch to enter the "OFF"-state.

Waiting 504 a predetermined time, upon determining that the first electrical potential is larger than the first threshold.

Comparing 505 the first electrical potential Vn2 with said first threshold voltage a second time, after waiting said predetermined time.

Maneuver 506 the switch to the "OFF" state after the second time if the first electrical potential is larger than the first threshold voltage, upon comparing the first electrical potential with said first threshold value for the second time.

Figure 6:
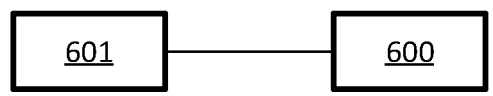
FIG. 6 is a block diagram illustrating a machine and computer readable memory.

FIG. 6 discloses a non-transitory computer readable media 600 having information embodied therein, said information including instructions for a machine 601 to execute the method as disclosed herein above with reference made to FIG. 5.

The invention claimed is:

1. An electronic circuit breaker with self-triggering protection for a vehicle, comprising:
   an input configured to be connected to an electric direct current (DC) power supply;
   an output configured to be connected to a load;
   a switch connected between the input and the output, wherein said switch is controlled via a switch control line between an "ON"-state and an "OFF"-state;
   a switch driver connected to the switch control line, said switch driver is configured to control the switch; and
   a switch protection connected between the input and the output and parallel with the switch, said switch protection is further connected to the switch control line, wherein the switch protection comprises:
      an over-voltage protection branch extending from the input to the output;
      a voltage detection branch extending from the input to the output and configured to output a first electric potential indicative of the electrical potential difference between the input and the output;
      a comparator circuit configured to compare the first electrical potential with a first threshold voltage, said first threshold voltage is indicative of an over-current level flowing through the switch, which over-current causes a voltage drop over the switch, said comparator circuit outputs a switch disable signal via a switch disable line upon detecting that the first electrical potential is above the first threshold voltage; and
      a gate controller connected to the switch disable line and configured to disable the switch by connecting the switch control line to a potential which causes the switch to enter the "OFF"-state.

2. An electronic circuit breaker according to claim 1, wherein the comparator circuit further is configured to:
   delay the switch disable signal a predetermined time in order to determine that the first electrical potential is above the first threshold voltage after said predetermined time, and thereby indicative of a short-circuit at the output.

3. An electric circuit breaker according to claim 1, wherein the voltage detection branch comprises:
   a first diode with a cathode connected to the input, and an anode connected to a second node, wherein:
   said second node is connected to said first node via a first resistor;
   said first node is connected to the output via a second resistor; and
   said first electric potential is at said first node.

4. An electronic circuit breaker according to claim 1, wherein:
   said switch is a MOSFET with a drain connected to the input and with a source connected to the output, and a gate is connected to said switch control line; and
   said gate controller is configured to disable the MOSFET by connecting the switch control line to the output via a first resistor, which causes the MOSFET to enter the "OFF"-state, upon receiving said switch disable signal at the switch disable line.

5. An electronic circuit breaker according to claim 1, wherein the over-voltage protection branch comprises a snubber circuit, said snubber circuit comprising:
   a capacitor connected in series with a resistor and a second diode in parallel with the resistor.

6. A battery junction box for a battery pack of a vehicle, comprising:
   a positive input terminal configured to be connected to a plus pole of at least one battery module;
   a negative input terminal configured to be connected to a negative pole of said battery module;
   a negative output terminal, wherein said negative input terminal is connected to said negative output terminal via a fuse in series with a main switch;
   a positive output terminal configured to be connected to the negative output terminal via load of the vehicle;
   a commutate circuit comprising a diode with a cathode connected to the positive output terminal, and an anode connected to said negative output terminal; and
   an electronic circuit breaker comprising:
      an input configured to be connected to an electric direct current (DC) power supply, said input connected to said positive input terminal;
      an output configured to be connected to a load, said output connected to said positive output terminal;
      a switch connected between the input and the output, wherein said switch is controlled via a switch control line between an "ON"-state and an "OFF"-state;
      a switch driver connected to the switch control line, said switch driver is configured to control the switch; and
      a switch protection connected between the input and the output and parallel with the switch, said switch protection is further connected to the switch control line, wherein the switch protection comprises:
         an over-voltage protection branch extending from the input to the output;
         a voltage detection branch extending from the input to the output and configured to output a first electric potential indicative of the electrical potential difference between the input and the output;
         a comparator circuit configured to compare the first electrical potential with a first threshold voltage, said first threshold voltage is indicative of an over-current level flowing through the switch, which over-current causes a voltage drop over the switch, said comparator circuit outputs a switch disable signal via a switch disable line upon detecting that the first electrical potential is above the first threshold voltage; and
         a gate controller connected to the switch disable line and configured to disable the switch by connecting the switch control line to a potential which causes the switch to enter the "OFF"-state.

7. A battery pack for a vehicle comprising at least one battery module with at least one battery cell and a battery junction box, wherein said battery junction box comprises:
   a positive input terminal configured to be connected to a plus pole of at least one battery module;
   a negative input terminal configured to be connected to a negative pole of said battery module;
   a negative output terminal, wherein said negative input terminal is connected to said negative output terminal via a fuse in series with a main switch;
   a positive output terminal configured to be connected to the negative output terminal via load of the vehicle;
   a commutate circuit comprising a diode with a cathode connected to the positive output terminal, and an anode connected to said negative output terminal; and
   an electronic circuit breaker comprising:
      an input configured to be connected to an electric direct current (DC) power supply, said input connected to said positive input terminal;
      an output configured to be connected to a load, said output connected to said positive output terminal;
      a switch connected between the input and the output, wherein said switch is controlled via a switch control line between an "ON"-state and an "OFF"-state;
      a switch driver connected to the switch control line, said switch driver is configured to control the switch; and
      a switch protection connected between the input and the output and parallel with the switch, said switch protection is further connected to the switch control line, wherein the switch protection comprises:
         an over-voltage protection branch extending from the input to the output;
         a voltage detection branch extending from the input to the output and configured to output a first electric potential indicative of the electrical potential difference between the input and the output;
         a comparator circuit configured to compare the first electrical potential with a first threshold voltage, said first threshold voltage is indicative of an over-current level flowing through the switch, which over-current causes a voltage drop over the switch, said comparator circuit outputs a switch disable signal via a switch disable line upon detecting that the first electrical potential is above the first threshold voltage; and
         a gate controller connected to the switch disable line and configured to disable the switch by connecting the switch control line to a potential which causes the switch to enter the "OFF"-state.

8. A vehicle comprising an electronic circuit breaker, said electronic circuit breaker comprising:
   an input configured to be connected to an electric direct current (DC) power supply;
   an output configured to be connected to a load;
   an input configured to be connected to an electric direct current (DC) power supply;
   an output configured to be connected to a load;
   a switch connected between the input and the output, wherein said switch is controlled via a switch control line between an "ON"-state and an "OFF"-state;
   a switch driver connected to the switch control line, said switch driver is configured to control the switch; and
   a switch protection connected between the input and the output and parallel with the switch, said switch protection is further connected to the switch control line, wherein the switch protection comprises:
      an over-voltage protection branch extending from the input to the output;
      a voltage detection branch extending from the input to the output and configured to output a first electric potential indicative of the electrical potential difference between the input and the output;
      a comparator circuit configured to compare the first electrical potential with a first threshold voltage, said first threshold voltage is indicative of an over-current level flowing through the switch, which over-current causes a voltage drop over the switch, said comparator circuit outputs a switch disable signal via a switch disable line upon detecting that the first electrical potential is above the first threshold voltage; and a gate controller connected to the switch disable line and configured to disable the switch by connecting the switch control line to a potential which causes the switch to enter the "OFF"-state.

9. A method of an electronic circuit breaker with self-triggering protection for a vehicle, wherein the electronic circuit breaker comprises:

an input configured to be connected to an electric direct current (DC) power supply;

an output configured to be connected to a load a switch connected between the input and the output, wherein said switch is controlled via a switch control line between an "ON"-state and an "OFF"-state;

a switch driver connected to the switch control line, said switch driver is configured to control the switch; and a switch protection connected between the input and the output and parallel with the switch, said switch protection is further connected to the switch control line, wherein the switch protection comprises:

an over-voltage protection branch extending from the input to the output;

a voltage detection branch extending from the input to the output and configured to output a first electric potential indicative of the electrical potential difference between the input and the output;

a comparator circuit configured to compare the first electrical potential with a first threshold voltage, said first threshold voltage is indicative of an over-current level flowing through the switch, which over-current causes a voltage drop over the switch, said comparator circuit outputs a switch disable signal via a switch disable line upon detecting that the first electrical potential is above the first threshold voltage; and a gate controller connected to the switch disable line and configured to disable the switch by connecting the switch control line to a potential which causes the switch to enter the "OFF"-state, wherein the method comprises:

determining if the switch is in the "ON" state;

measuring a first electrical potential indicative of the current flowing from the input terminal to the output terminal, upon determining that the switch is in the "ON"-state;

comparing the first electrical potential with a first threshold voltage, which is indicative of an over-current level of the switch; and if the first electrical potential is larger than the first threshold, causing the switch to enter the "OFF"-state.

10. A method of controlling an electronic circuit breaker according to claim 9, wherein the method further comprises:

waiting a predetermined time, upon determining that the first electrical potential is larger than the first threshold;

comparing the first electrical potential with said first threshold voltage a second time, after waiting said predetermined time; and controlling the switch to the "OFF" state after the second time, if the first electrical potential is larger than the first threshold voltage, upon comparing the first electrical potential with said first threshold value for the second time.

11. A non-transitory computer readable media comprising program instructions stored thereon for use with an electronic circuit breaker with self-triggering protection for a vehicle, wherein the electronic circuit breaker comprises:

an input configured to be connected to an electric direct current (DC) power supply;

an output configured to be connected to a load;

a switch connected between the input and the output, wherein said switch is controlled via a switch control line between an "ON"-state and an "OFF"-state;

a switch driver connected to the switch control line, said switch driver is configured to control the switch; and a switch protection connected between the input and the output and parallel with the switch, said switch protection is further connected to the switch control line, wherein the switch protection comprises:

an over-voltage protection branch extending from the input to the output;

a voltage detection branch extending from the input to the output and configured to output a first electric potential indicative of the electrical potential difference between the input and the output;

a comparator circuit configured to compare the first electrical potential with a first threshold voltage, said first threshold voltage is indicative of an over-current level flowing through the switch, which over-current causes a voltage drop over the switch, said comparator circuit outputs a switch disable signal via a switch disable line upon detecting that the first electrical potential is above the first threshold voltage; and a gate controller connected to the switch disable line and configured to disable the switch by connecting the switch control line to a potential which causes the switch to enter the "OFF"-state, said computer program instructions configured to cause one or more control devices to perform the following operations:

determining if the switch is in the "ON" state;

measuring a first electrical potential indicative of the current flowing from the input terminal to the output terminal, upon determining that the switch is in the "ON"-state;

comparing the first electrical potential with a first threshold voltage, which is indicative of an over-current level of the switch; and if the first electrical potential is larger than the first threshold, causing the switch to enter the "OFF"-state.

* * * * *